United States Patent [19]

Levine

[11] 4,010,319

[45] Mar. 1, 1977

[54] SMEAR REDUCTION IN CCD IMAGERS

[75] Inventor: Peter Alan Levine, Trenton, N.J.

[73] Assignee: RCA Corporation, New York, N.Y.

[22] Filed: Nov. 20, 1975

[21] Appl. No.: 633,689

[52] U.S. Cl. ................................... 358/213; 357/24
[51] Int. Cl.² .................... H04N 5/38; H01L 29/78
[58] Field of Search ............ 250/211 J; 357/24, 30;
307/221 D, 304; 340/173 LM, 173 CA;
315/169 TV; 178/7.1, 7.3 D

[56] References Cited

UNITED STATES PATENTS

| 3,801,884 | 4/1974 | Sequin | 357/30 X |
| 3,856,989 | 12/1974 | Weimer | 178/7.1 |
| 3,904,818 | 9/1975 | Kovac | 250/211 J X |
| 3,931,463 | 1/1976 | Levine | 357/24 |
| 3,937,874 | 2/1976 | Carbone | 357/24 |
| 3,946,151 | 3/1976 | Kamiyama et al. | 178/7.1 |

Primary Examiner—Robert L. Griffin
Assistant Examiner—Aristotelis M. Psitos
Attorney, Agent, or Firm—H. Christoffersen; Samuel Cohen

[57] ABSTRACT

Radiation illuminating the A register of a charge-coupled device (CCD) imager of the field transfer type during the transfer of a field from the A to the B register results in smear in the reproduced image. The smear charge signals are sensed during one line time of a field and stored, and the stored signals are employed to cancel the effects of the smear charge signals of the other lines of a field.

13 Claims, 12 Drawing Figures

SMEAR REDUCTION IN CCD IMAGERS

The present application deals with charge-coupled device imagers and, particularly, with the problem of smear in such imagers. The invention is illustrated in the drawing, of which:

Figure 1:
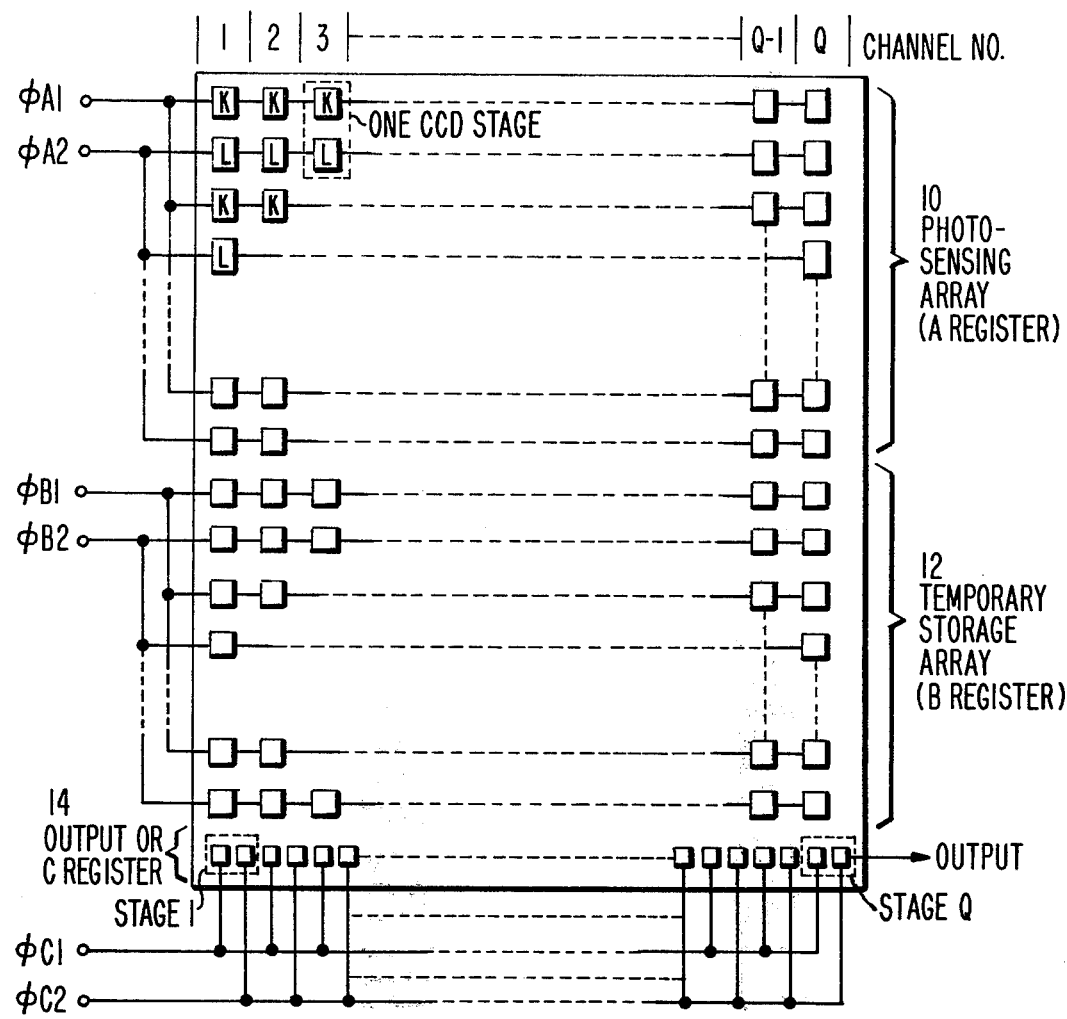
FIG. 1 is a schematic showing of a known CCD imager of the field-transfer type.

The known system of FIG. 1, a two-phase charge-coupled device (CCD) imager, includes a photosensing array 10, known as an A register, a temporary storage array 12, known as a B register, and an output register 14, known as a C register. The B and C registers are masked, that is, means are provided for preventing a radiant energy image from reaching either register.

The A and B registers may have channel stops (not shown explicitly) extending in the column direction to isolate the channels (the columns of the CCD) from one another. The electrodes (K and L, per stage) shown schematically, may be any one of the usual overlapped polysilicon, or polysilicon overlapped by metal, or other two-phase structures for insuring unidirectional signal propagation. The imager, while illustrated to be two-phase operated may, of course, be a three or higher phase operated imager instead. One such imager commercially available from RCA Corporation as SiD 51232 and known as "Big Sid" is three-phase operated and has 320 columns and 512 rows (256 in the A register and 256 in the B register).

The operation of the array of FIG. 1 is well understood. During the so-called integration time, a scene or other image is projected onto the A register. The light or other radiant energy of the image causes charges to be produced at the various locations of the A register, in accordance with the light intensity reaching the respective locations.

Upon the completion of the integration time (during the vertical blanking interval of commercial television), the charge signals which have accumulated (a "field") are transferred, in parallel, in the column direction from the A to the B register by the application of the multiple phase voltages $\phi_{A1}$, $\phi_{A2}$, $\phi_{B1}$ and $\phi_{B2}$. The charges subsequently are transferred, a row at a time, from the B register to the C register, and as each row of charges reaches the C register, it is serially shifted out of the C register in response to the shift voltages $\phi_{C1}$, $\phi_{C2}$. The serial shifting of the C register occurs at relatively high speed (during a "line time" of commercial television). During the transfer of a field from the B to the C register, a new field may be integrated in the A register.

During the transfer of a field of charge signals from the A register to the B register, the radiation which continues to illuminate the A register produces smear in the reproduced image. The smear is proportional to the radiation intensity and to the number of rows illuminated (the size in the column direction of the image), and to the speed of transfer from the A to the B register. The mechanism by which the smear is generated is illustrated in FIG. 2 which describes what occurs when a bright image is present. It is to be understood, of course, that not-so-bright images also cause smear to be produced but at a lower intensity.

Figure 2A:
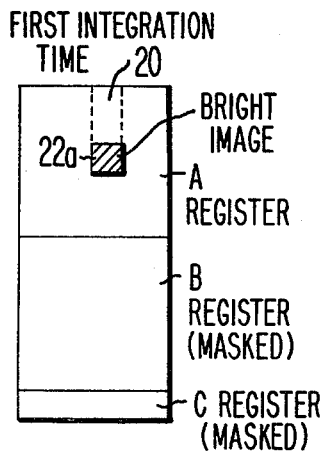
FIGS. 2a – 2c are schematic showings which illustrate the problem of smear.

Referring first to FIG. 2a, assume that a scene (not shown) is being imaged onto the A register of the imager and that this scene includes a bright image, illustrated schematically by the square cross hatched area 22a. In the discussion which follows, only this bright image will be considered. During the first integration time, shown in FIG. 2a, the bright image causes charges to accumulate in the area of the substrate illuminated by the bright image.

Figure 2B:
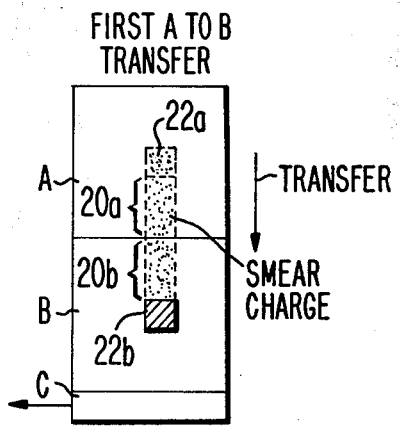

FIG. 2b illustrates what occurs during the first transfer of the field in the A register to the B register. This occurs, as already mentioned, during the vertical blanking time and at relatively high speed. During the transfer the A register is not shuttered or masked in any other way. Therefore, the bright image remains focused on the substrate as the multiple phase voltages applied to the A and B registers transfer the charges from the A to the B register. During the transfer, the potential wells formerly in the region 20 of FIG. 1 pass beneath the bright image. While they do move at a relatively high speed, the bright image does cause a certain amount of charge signal to be produced and to accumulate in these potential wells. The greater the transfer speed, the fewer charges which will accumulate; however, the maximum speed at which the transfer can take place is limited by such factors as the capacitance and resistance of the charge transfer electrodes and other factors.

The result of the above is illustrated in FIG. 2b which shows the condition of the imager at the end of the first transfer time. The B register is storing the charge at 22b which was transferred from 22a of the A register. In the region 20b of the B register smear charge is present. This region 20b corresponds to region 20 of FIG. 2a. There is also smear charge present in region 20a of the A register. Region 20a consists of potential wells moved under the bright image but which were not propagated sufficiently far to reach the B register.

Figure 2C:
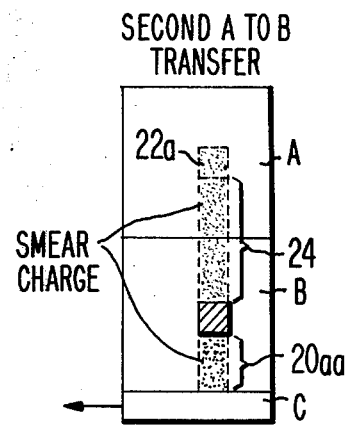

After the first transfer illustrated in FIG. 2b, there is a second integration time which is not illustrated and then a transfer of the second field from the A to the B register. At the end of the second transfer, the situation is as depicted in FIG. 2c. The smear charge formerly at 20a (FIG. 2b) has been shifted to positon 20aa and there is also smear charge in the region 24 for reasons similar to those just discussed in connection with 20a and b of FIG. 2b.

Figure 3A:
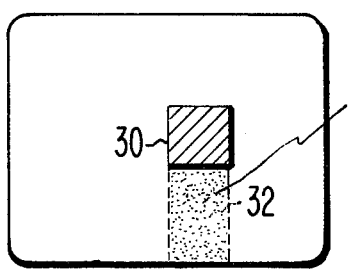
FIGS. 3a and 3b show how smear is manifested in the reproduced image.

As already mentioned, the charge signals transferred to the B register are later shifted out, a line at a time, to the C register and the contents of the C register are then transferred serially out of the C register. The signals shifted out of the C register are video signals and they may be subsequently displayed on the screen of a kinescope. The display, after the first transfer, is shown in FIG. 3a. There is a bright image at 30 corresponding to the bright image which caused the charge pattern 22a of FIG. 2a and there is smear at 32 below the bright image. Note here that the optical system in the imager causes the image projected on to the imager to be an upside-down version of the original scene and the readout, bottom line first, followed by the reconstituting of the image on the kinescope screen starting at the top line first, turns the picture over again. This is the reason the smear 32 appears at the bottom in the displayed image and on the top (20b) of the B register in FIG. 2b. Note also that the assumption is made in the illustrations of FIG. 2 that the observer is facing the surface illuminated of the A register and that the C register is read out right-to-left.

The smear 32 manifests itself as illumination at a lower intensity than the image 30 but which can be sufficiently visible appreciably to affect picture quality. Even 5 to 10 percent smear is noticeable and it is not unusual to have smear levels of 30 percent or more of the intensity of the image 30. The latter are especially disturbing.

Figure 3B:
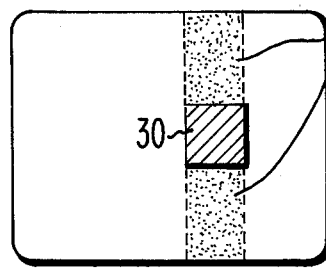

The display of FIG. 3a occurs only once and ordinarily is not seen, as such, by the observer. Rather the latter sees the display of FIG. 3b which occurs at the field repetition rate. The display of FIG. 3b corresponds to the charge pattern stored in the B register as shown in FIG. 2c. Note that there is smear in the reproduced image both below and above the bright region 30.

Figure 4:
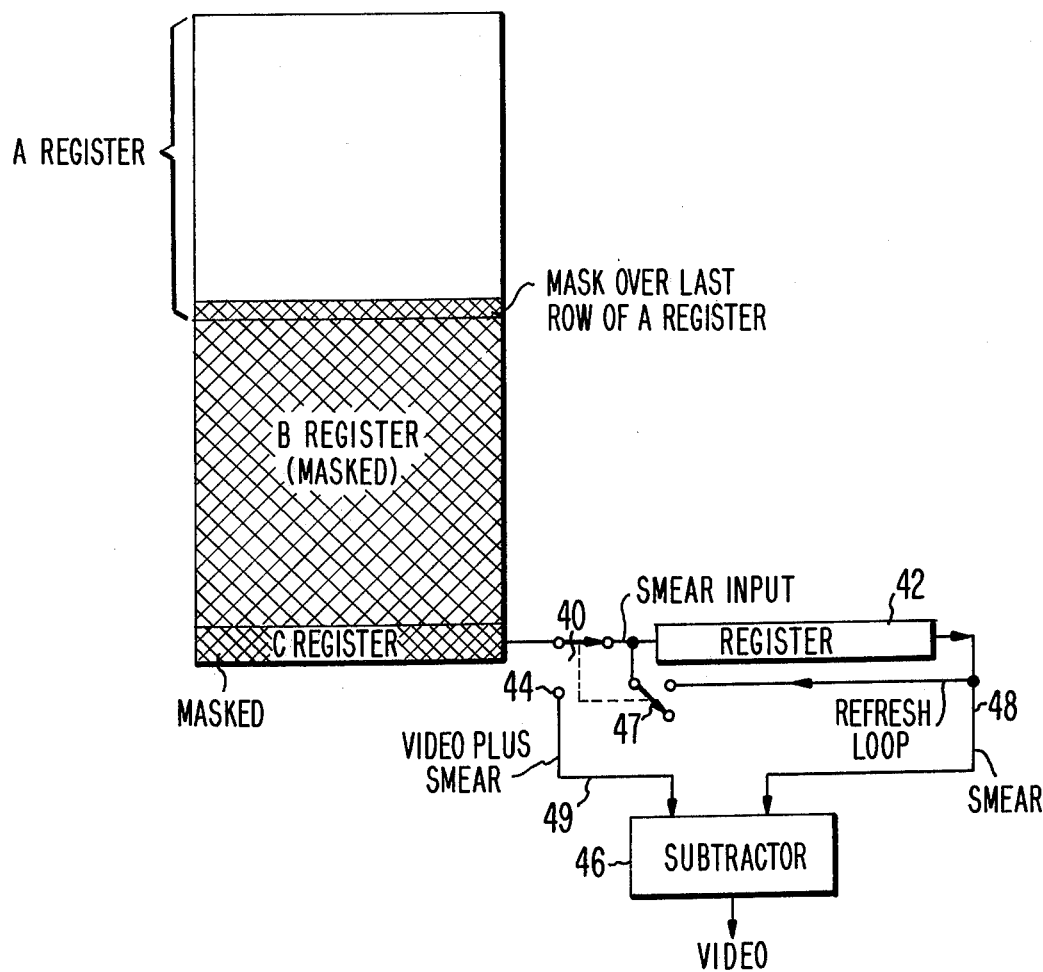
FIG. 4 is a block diagram of a system embodying one form of the present invention.

A CCD imaging system embodying the invention and including means for substantially reducing the smear is illustrated in FIG. 4. Here and in the remaining figures the output of the C register is shown at the right end thereof for the sake of drawing convenience; however, it is to be understood that the convention employed is the same as that discussed in connection with FIGS. 2 and 3. That is, the direction of readout from the C register is such as to produce a reconstructed image on the kinescope screen which is in the same orientation as the image being "viewed" by the A register. The A, B and C registers may be the same registers as shown in the prior art; however a small part of the A register is masked. In particular, the last row of the A register is shown masked, although it is possible to mask any undisplayed row as will become clear later in connection with FIG. 8. The masking causes only a small amount of the information which is available to be lost.

In view of the fact that the last row of the A register is masked, if no modification is made to the kinescope display, the last row displayed will contain no picture information and, in general, will be dark. In a preferred form of the invention, however, rather than displaying the last row of the A register, the imager can be built with an extra non-displayed row or the centering and size of the picture can be made such that the last row is not visible.

The system of FIG. 4 also includes a switch 40 illustrated as a mechanical switch but which, in practice, is an electronic switch. During one period of time, which may be one line time (or as discussed later, a longer period) the switch connects to register 42. During the remaining line times of the field, the switch connects to terminal 44 which leads to a difference circuit or subtractor 46. The register 42 includes a refresh loop for continuously circulating the contents of this register refreshing the same in the process. A more detailed showing of such a "register" appears in FIG. 5 which will be discussed shortly.

In the operation of the system of FIG. 4, at the end of the first transfer of the integrated field from the A to the B register, the situation is somewhat as shown in FIG. 2b. The region 20a extends to the last row of the A register so that this last row (masked in FIG. 4) is storing smear charge signals. Note that the masked row cannot receive radiation so it cannot receive any information signal directly. Moreover, at the end of the first and each following transfer time, the signal present is only smear signal because the apparent origin of signal shifted into this row (other than the smear signal generated during the A to B transfer) is above the A register, that is, it is an imaginary row immediately above the first row of the A register. So, no information signal can integrate in this imaginary row and be subsequently shifted to the masked row. In other words, the smear charge signal which ends up in the masked row of the A register, is "uncontaminated" by information signal.

Next the second integration time occurs and then the second transfer of a field from the A to the B register. At the end of this second transfer, the situation is somewhat as depicted in FIG. 2c. However, now the last row of the B register is storing only smear charge signal uncontaminated by information signal. Thereafter, the contents of the B register are shifted to the C register, a row at a time, and each row of information reaching the C register is shifted out of the C register in serial fashion. The first row of information reaching the C register contains only smear signals.

Referring again to FIG. 4, assume that the last row of information stored in the B register, that is, the one containing smear signals, has been shifted into the C register. Switch 40 is placed in the position shown, that is, connecting the C register with register 42. Register 42, in this embodiment, is assumed to contain the same number of stages as the C register and is assumed to be an analog signal storage register, such as another CCD register. The contents of the C register may be shifted serially to register 42 by employing for example, the same multiple phase source (such as $\phi_{C1}$, $\phi_{C2}$ shown in FIG. 1) for both registers. Switch 47 in the feedback loop is open at this time.

Next, switch 40 is moved to engage contact 44, switch 47 is closed and this closes the feedback loop, and at the same time the next row of charge signals is shifted from the B to the C register. This next row contains information signals and if smear is present, also includes smear. The contents of the C register is now shifted serially to the subtractor 46 which may be a differential amplifier as an example. Concurrently, the contents of register 42 is shifted serially, via lead 48, to the subtractor 46. The latter subtracts the smear signal present on lead 48 from the video plus smear signal on lead 49 and produces a video output signal which is free of smear signal or at least which has smear signal of substantially smaller amplitude than that appearing on lead 49.

At the same time that the smear signal is being supplied by register 42 to subtractor 46, it is being circulated back to the input circuit to the register 42 via closed switch 47 and refreshed in the process. The refresh stages are included within the register 42 and a typical example of how the refreshing may be accomplished is discussed later in connection with FIG. 5.

The process above is repeated for each row of information stored in the B register until the entire field of information has been processed. For example, assuming the field to consist of one masked row and 255 other rows, the process is continued until all remaining 255 rows have been shifted out of the B register. Thereafter, the following field is processed in exactly the same way. The first row of information reaching the C register of the following field contains smear charge signals which formerly were present in the masked row of the A register. This row is shifted into register 42 while, for example, the feedback loop is open or after the contents of the register 42 have been erased. The opening of the feedback loop is illustrated schematically by switch 47 in the feedback loop which is ganged to switch 40 and which is open when 40 is in the position shown and closed when 40 makes contact with contact 44. In practice, switch 47, like the other switches, is an electronic switch. After register 42 is loaded again, the following steps are exactly like those already described.

Figure 5:
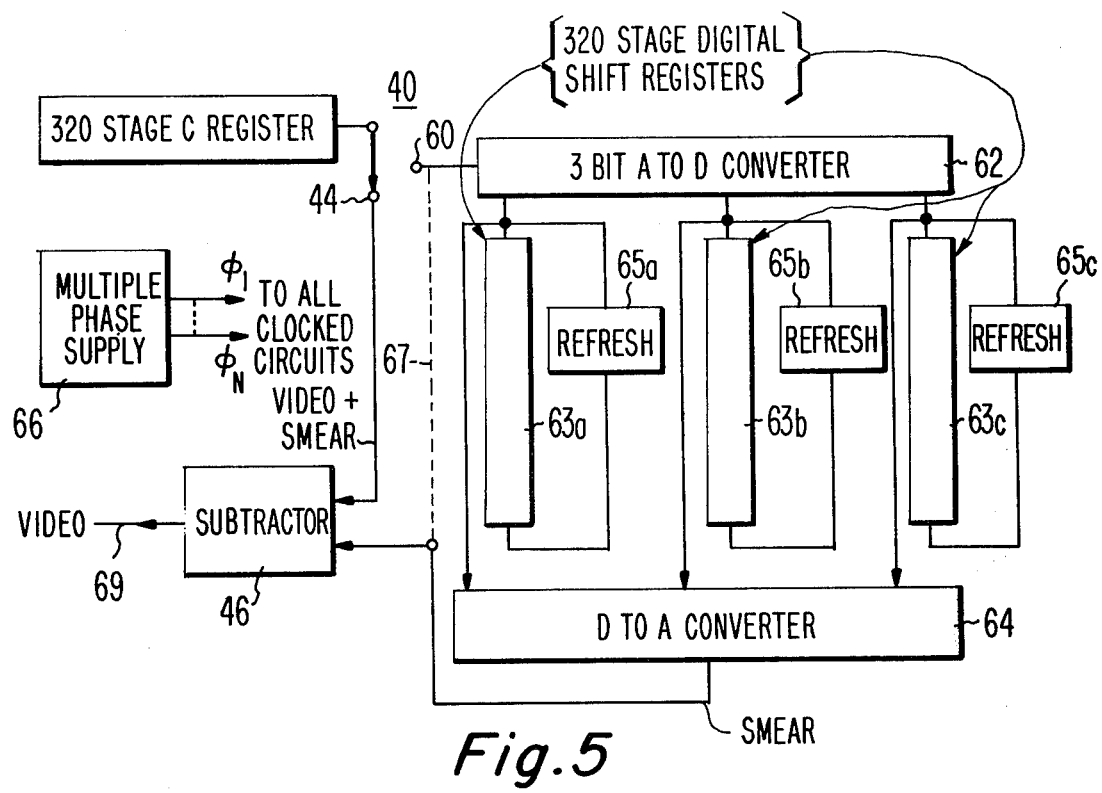
FIG. 5 is a block diagram showing in more detail one way in which the system of FIG. 4 may be implemented.

A particular embodiment of the system of FIG. 4 is illustrated in FIG. 5. It is assumed for purposes of this illustration that the C register is a 320 stage register. When the C register is loaded with the smear charge signals only, received from the masked row of the A register, switch 40 is made to engage contact 60. The latter connects to an analog-to-digital (A to D) converter 62 which, for purposes of illustration, is shown to be a three-bit A to D converter. This makes possible the translation of the analog signals shifted into converter 62 to a three-bit code which can represent eight different binary levels. The converter 62 connects to three digital shift registers 63a–63c, each such register having 320 stages. These can be CCD registers or, alternatively, other forms of registers such as MOS transistor or bipolar transistor registers, or bucket brigade registers, as examples. Each register 63 continuously circulates the information being stored as indicated schematically by the three feedback loops with the three refresh stages 65a, 65b and 65c respectively. The form the latter take will depend upon the register being employed. In the case of a transistor register, the refresh circuit may, for example, simply be a threshold circuit for distinguishing between 1's and 0's followed by an amplifier for returning the signals to standard levels for these bits. In the case of CCD registers, a "regeneration circuit" such as any one of those shown in U.S. Pat. No. 3,760,202 issued Sept. 18, 1973 to W. F. Kosonocky (see FIGS. 29–40) may be employed.

The registers 63 connect to a digital-to-analog converter 64 and the output of the converter is supplied to subtractor 46. The output of the D to A converter, in an alternative form of system, may also be used for refresh purposes as indicated by dashed line 67. In such an embodiment, the feedback loops for the registers 63 would be eliminated. However, using line 67 as a feedback connection is not a preferred embodiment, for many applications. The reason is that in the case the A to D converter 62 has to operate at the same speed as the registers 63 during the time video signal is being produced and where this speed is high, a relatively expensive converter will have to be employed. When the A to D converter 62 is not in the feedback loop, the circuit can be operated at low speed during one period of time, namely during the initial transfer from the C register to the registers 63 via the A to D converter 62. (It can be performed, for example, during the vertical blanking interval as will be discussed later.) And then, during the remaining time, as the converter 62 is out of the loop, the registers 63 can be speeded up to produce video output at 69 at the desired relatively high frequency. Note here that while D to A converter 64 is in the circuit during the generation of video signal and therefore would have to operate at high speed in the case of commercial television, many forms of relatively inexpensive D to A converters can be operated at such high speed. Such a converter may comprise nothing more than a network of weighted resistors, for example.

The reason for employing a digital rather than an analog CCD feedback loop in FIG. 5 is that it is difficult, as a practical matter, to refresh analog information directly because it is difficult to distinguish between different levels of an analog signal and it is equally difficult to return the signals to their previous levels. It is found that after some relatively smaller number of recirculations, the information content of the analog signals no longer can be obtained from these signals because of the deterioration they have suffered. In a digital system, on the other hand, it is only necessary to distinguish between two signal levels, one representing binary zero and the other binary one, and to return the signals to one or the other of these levels. This can be done rather easily.

In the operation of the system of FIG. 5, all of the stages may be driven by a multiple phase supply shown generally at 66. In the case of a system such as the "Big Sid," the supply will be a three-phase supply. Assume the contents of the C register, when it contains only smear charge signals, is being shifted to A to D converter 60. It will be assumed, for purposes of the present explanation, that the shifting occurs at a speed sufficient to empty the C register in one line time (one horizontal line time of commercial television). The possibility of supplying smear charge signal to the A to D converter at lower speed (from a buffer register) during the relatively longer vertical blanking time of television, for example, is discussed later in connection with FIG. 8.

Each charge signal received is converted to a three-bit code by converter 62. The first, second and third bits of this code are applied to the three shift registers 63a, 63b, and 63c, respectively. Concurrently, a row of information signals is transferred, in parallel, from the B to the C register. Thereafter, these charge signals are shifted serially to the subtractor 46. Concurrently, the refreshed contents of the three registers 63a–63c are shifted serially into the D to A converter 64. The latter converts each three bits it receives to an analog signal which may be at one of eight different levels. Each such signal corresponds to a smear level and each is compared by circuit 46 with a corresponding video plus smear signal received from the C register. The output of the subtractor 46 is video signal which is relatively free of smear. The signals produced by the three registers 63 are also supplied back to the input circuits of these three registers (after being refreshed) so that at the end of each line time each register is again ready to repeat the same smear charge pattern.

The process above is repeated for all following rows (lines) of the integrated field stored in the C register just as in FIG. 4. After all of the lines of one field are processed, the lines of the following field are processed in the same way. However, as in the case of FIG. 4, the feedback loops should be opened while shifting new smear signals into registers 63 or these registers should be erased, for example, by filling them with zeros, prior to the entry of new smear signals.

While for purposes of illustration the smear information is shown to be stored as a three-bit code for representing eight different levels, it is to be understood that this is an example only. In many instances adequate smear reduction can be obtained using a smaller number of levels (four or less may be adequate in some cases). Alternatively, by using a four-bit analog-to-digital converter and four rather than three shift registers 63, sixteen rather than eight smear charge signal levels can be produced.

Figure 6:
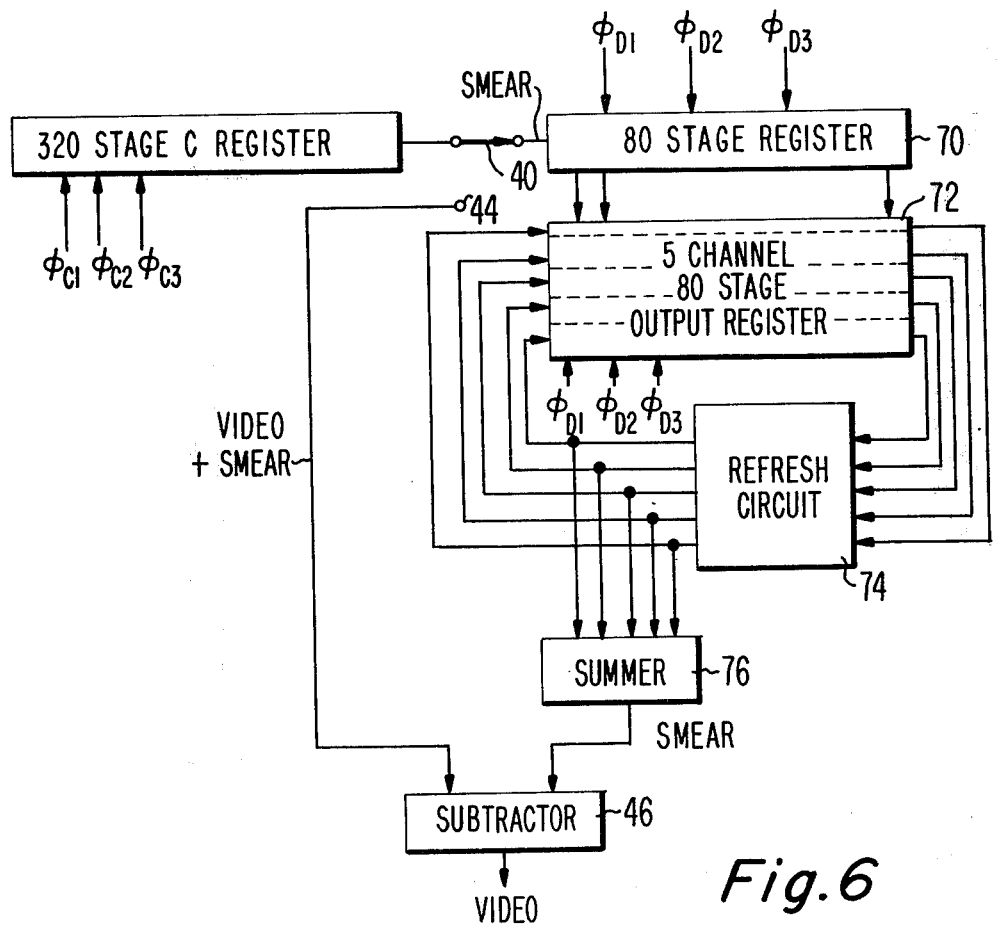
FIG. 6 is a block diagram of a system embodying another form of the present invention.

Another embodiment of the invention is illustrated in FIG. 6. Here the CCD register 70 connected to the C register has a smaller capacity than the C register. For example, assuming a 320 stage C register, register 70 may have one-quarter of this capacity, that is, 80 stages. In this case register 70 and the following 5-channel output register 72 will be driven by multiple phase voltages $\phi_{D1}$, $\phi_{D2}$, $\phi_{D3}$ which are at a frequency one-quarter of that of the multiple phase voltages $\phi_{C1}$, $\phi_{C2}$, $\phi_{C3}$ driving the C register. The output register 72 converts the analog signal of register 70 to a five digit binary signal. The output of this register 72 is applied via a refresh circuit 74 to the input to the register 72. The output of the refresh circuit also connects to a summer 76 whose output signal is applied to subtractor 46.

The five signals circulated in register 72 are not binary coded signals. Rather, the number of 1's which are present represent the amplitude of the analog signal. Thus, the system (with five channels in register 72) can represent five different analog signal levels (in addition to zero level). The system 70, 72, 74, 76 is described, in detail, in my copending U.S. application Ser. No. 547,129, now U.S. Pat. No. 3,958,210 for "Charge-Coupled Device Systems," filed May 5, 1975 and assigned to the same assignee as the present application.

Figure 7A:
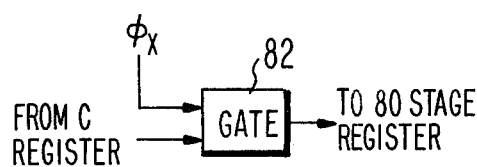
FIGS. 7a and 7b are block diagrams showing circuits which may be incorporated in the system of FIG. 6.

In the operation of the system of FIG. 6, assuming the smear charge signal to be stored in the C register, it is first shifted via switch 40 to the 80 stage register 70. Since register 70 can only store one-fourth of the information in the C register, there must be a translation means between the two. One form is shown in FIG. 7a and it consists of analog gate 82. The gate is clocked by pulse $\phi_x$ which is in synchronism with, for example, an initial portion of a pulse such as $\phi_{D3}$ so that only the contents of every fourth stage of register C passes into register 70. Since the smear information is relatively uniform from stage-to-stage, it is ordinarily adequate to sample in this fashion.

Figure 7B:
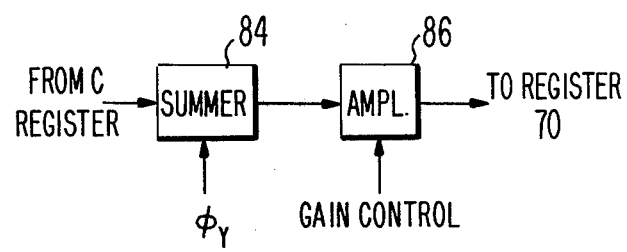

As an alternative, the circuit used in FIG. 7b may be employed instead. Here a pulse $\phi_Y$ which is synchronous with a pulse such as a pulse $\phi_{D3}$, is employed to turn on a serial summer 84. The summer adds the successive signals reaching it from four successive stages of the C register. The summed signal is then applied through amplifier 86 to register 70. The gain control adjustment is made to be such that the output of amplifier 86 is a signal at a level which is equal to approximately one-fourth of the amplitude of the signal produced by the summer 84. Thus, the signal supplied to register 70 is approximately the average value of the signal stored in four successive stages of the C register.

As a third alternative (not illustrated), a low pass filter may be employed for smoothing the output of the 320 stage register and also a means for gating the output of this filter into register 70 at a frequency synchronous with that of register 70.

While not shown explicitly, it is to be understood that a circuit such as that of FIG. 7a or of FIG. 7b or the third alternative above may be included within block 70 in the input circuit to this register.

After register 70 is loaded, switch 40 is changed to position 44 and the remaining rows of the field are subsequently shifted from the C register to subtractor 46. At the same time that subtractor 46 is receiving the video plus smear signals from the C register, it is receiving smear signals from the summer 76. The latter are obtained in the following way. First register 70 transfers, in parallel, its charge signals to five-channel output register 72. As explained in the copending application, there is an automatic translation, in the transfer process, of each signal stored in the 80-stage CCD register 70 to a five-bit signal stored in the corresponding stage of the five-channel output register. These five channels of signals are propagated in parallel to the refresh circuit 74 at a rate one-fourth that of the transfer of signals down the C register. The circuit 74 may include amplifiers for regenerating the signals it receives, each of which has a value representing a one or a zero, to a refreshed one or zero signal level. Each group of five such signals is supplied both to the input to register 72 and to summer 76. The summer sums the five signals it receives and produces an output smear signal at one of five different levels or at zero level. The summer includes a signal storage means such as a capacitor or the like for storing the five level signal for one complete period of one of the multiple phase voltages, such as $\phi_{D3}$, employed to operate the registers 70 and 72. This smear signal is compared with (subtracted from) four successive video plus smear signals arriving from the C register. The comparison is accomplished by subtractor 46 which produces the video output signals subsequently displayed. The subtractor preferably is one of the clocked type operated synchorously with the C register by one of the $\phi_C$ voltages, for example. Alternatively, low pass filters may be placed in the two input leads to the subtractor for smoothing the "smear" and "video plus smear" signals applied to the subtractor.

The process described above is repeated for each field. As in the case of the other embodiments, prior to the transfer of smear signals into them, the registers 70 and 72 must be cleared. Register 70 is clear at the time the smear signals arrive as it transferred its contents to register 72 at the beginning of the previous field. Register 72 may be cleared by opening the feedback loops and applying the multiple phase shift signals $\phi_{D1}$, $\phi_{D2}$, $\phi_{D3}$. This can be done, at high speed if desired, during or just before the time register 70 is being loaded from the C register.

Figure 8:
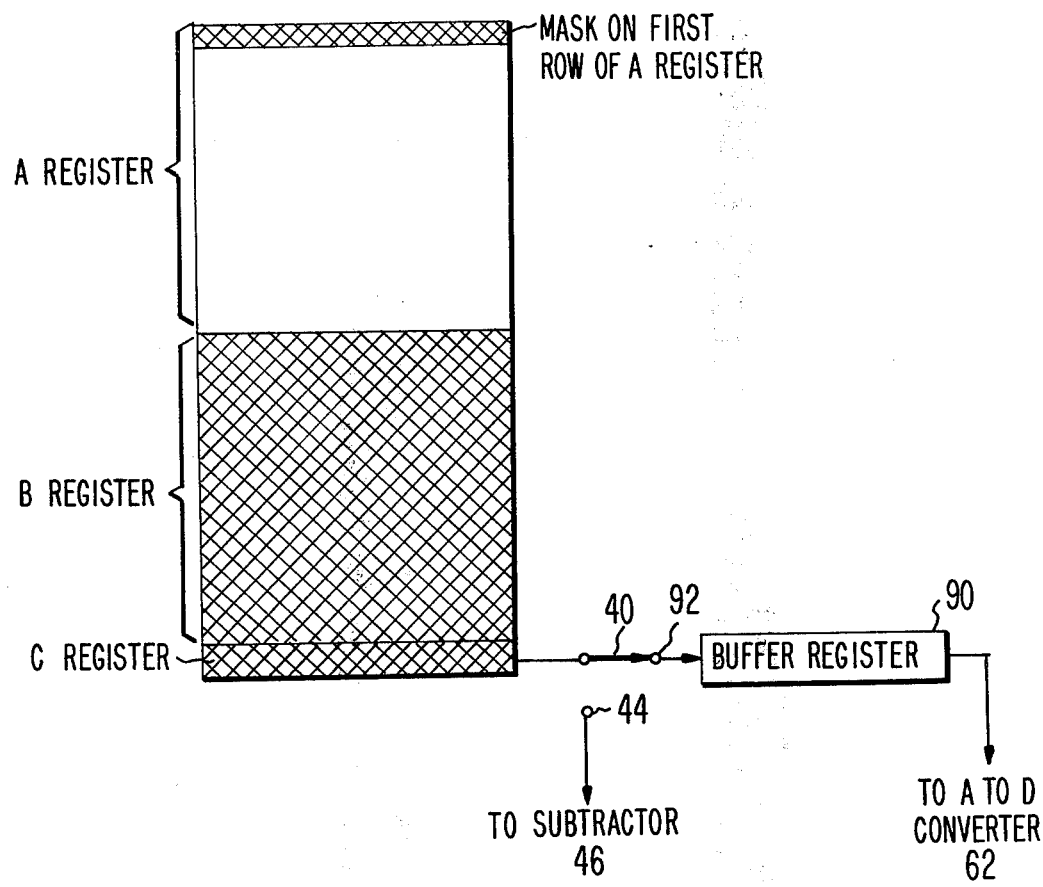
FIG. 8 is a block diagram of a system embodying another form of the invention.

An embodiment of the invention is which the A to D converter corresponding to 62 of FIG. 5 can be operated at relatively low speed is illustrated, in part, in FIG. 8. The A, B and C registers are the same as shown in FIG. 4; however, the mask is over the first rather than the last row of the A register. Also, there is a buffer register 90 connected through switch 40 to the C register for reasons which will become clear in the explanation which follows. The buffer register 90 may be a CCD register having the same number of stages as the C register. The buffer register 90 operates at the same speed as the C register during one period of time, namely during the time the C register is shifting its contents (smear charge signals) to the buffer register via switch 40. Thereafter, during the vertical blanking time, the buffer register is operated at much lower speed during the time it is shifting its contents to the A to D converter.

In the operation of the system of FIG. 8, assume the same conditions as shown in FIG. 2. After the first A register to B register transfer, the charge pattern is as illustrated in FIG. 2b. Smear charge signal is now present in the first (topmost) row of the B register. This smear charge signal is uncontaminated by information in view of the fact that the corresponding row of the A register is masked.

During the second A to B transfer, each row of of the B register is successively transferred, in parallel, to the C register. In due course, the (topmost) row of charge signals reaches the C register. When this occurs, switch 40 of FIG. 8 is changed from its normal position engaged with contact 44 to the position shown in FIG. 8 engaged with contact 92 which leads to buffer register 90. Now this first row is shifted at high speed through switch 40 to the buffer register 90. The C register is cleared in the process. Thus, the buffer register 90 is now storing the smear charge signal which formerly was present in the first (topmost) row of the B register. Switch 40 is then returned to contact 44.

The next thing which occurs in the timing sequence is the vertical blanking interval. During this vertical blanking interval the buffer register may be operated at relatively slow speed to shift its contents into the A to D converter corresponding to 62 of FIG. 5. This permits a relatively inexpensive converter to be employed. Recall that as illustrated in FIG. 5, the refreshing (which occurs later) may be performed at each shift register 63 with the converter 62 out of the feedback loop. Accordingly, the converter is never required to operate at high speed.

The remainder of the operation of the circuit of FIG. 8 is just as previously described. After all of the lines 63 of FIG. 5 have been loaded, that is, at the end of the vertical blanking interval, the next field is transferred from the B to the C register a row at a time. The switch 40 is back in contact with contact 44. The subtractor 46 of FIG. 5 which, as already indicated, may be a differential amplifier, compares each video plus smear signal arriving from the C register with the smear signal produced by converter 64 of FIG. 5 to obtain a difference video signal relatively free of smear.

What is claimed is:

1. In a CCD imager of the type having an imaging region onto which an image is projected for producing a charge pattern field and in which, after the pattern is produced, it is transferred out of the imaging region while the image remains projected thereon, whereby smear charge signals are produced during such transfer, and wherein the transferred pattern is subsequently read-out, a method for substantially reducing the effect of the smear charge signals comprising the steps of:
   producing a signal pattern representing the smear charge signal pattern present in one line of a field;
   storing that signal pattern for an interval equal to at least the time required to read out the following lines of a field; and
   as said following lines of said field are read-out, subtracting from the line of charge signals being read the stored signal pattern.

2. A method as set forth in claim 1 wherein the charge signals in each line of a field are read out serially and wherein the subtraction is performed serially for each line.

3. A method as set forth in claim 1 wherein said signal pattern is stored by continuously circulating the signals around a closed loop while refreshing them in the process.

4. A method as set forth in claim 3 wherein said signal pattern comprises an analog signal pattern.

5. A method as set forth in claim 3 wherein said step of producing a signal pattern includes the step of translating each smear charge signal to a group of N signals, each at one of two discrete levels, where N is an integer greater than 1.

6. A CCD imager system comprising, in combination:
   a CCD imager of the type including an A A register, onto which an image is projected, a masked B register to which the charge pattern of the A register is shifted after a field has been integrated in the A register and while the A register remains unmasked, and a masked C register into which the charge pattern stored in the B register is shifted, at most a row at a time, and from which the charge signals are shifted in serial fashion;
   means for masking at least one row of the A-register, whereby after at most two transfers of a charge pattern field from the A to the B register, there is stored in a row in said B register corresponding to said masked row of said A register, a smear charge pattern;
   memory means;
   means for transferring a signal representation of the smear charge pattern, after it reaches the C register, to said memory means;
   means for serially reading out the signals stored in said memory synchronously with following readouts of the C register; and
   means for subtracting the signals read from the memory from the signals serially read out of the C register, for producing difference serial output signals in which the smear component is at least substantially reduced.

7. A CCD imager system as set forth in claim 6 wherein said means for masking comprises means for masking the last row of said A register.

8. A CCD imager system as set forth in claim 6 wherein said means for masking comprises means for masking the first row of said A register.

9. A CCD system as set forth in claim 8 wherein said charge pattern is serially shifted from said C register during a line time, wherein a charge field is shifted from the A to the B register during a substantially longer vertical blanking period, and wherein said memory means includes a buffer register for producing a serial output, and an analog-to-digital converter receptive of said serial output of said buffer register, said means for transferring comprising means for serially shifting the contents of said C register to said buffer register during one line time, and means for shifting the contents of said C register to said buffer register at substantially slower speed during said vertical blanking period.

10. A CCD imager system as set forth in claim 6 wherein said memory means comprises means for translating each charge signal received from said C register to a multiple bit signal pattern, a plurality of delay means, one for each bit of the pattern, each delay means receptive of a different bit of each multiple bit signal pattern, means for refreshing each signal reaching the end of a delay means and applying the refreshed signal back to the input end of the same delay means, whereby each delay means continuously circulates the signal it is storing, and means for translating each pattern produced by said plurality of delay means into the analog signal that pattern represents.

11. A CCD imager system as set forth in claim 10 wherein each said delay means comprises a CCD register having the same number of stages as said C register.

12. A CCD image system as set forth in claim 6 wherein said smear charge pattern comprises an analog signal pattern and wherein said memory means comprises means for translating said analog signals into a plurality of binary signal patterns, on a one-to-one basis, that is, one group of binary signals representing one analog signal, and wherein said memory means further comprises a plurality of closed loops, each for continuously circulating a different signal of said binary signal patterns, and an output circuit for retranslating said binary signal patterns to the analog signals they represent.

13. A CCD image system as set forth in claim 6 wherein said smear charge pattern comprises an analog signal pattern and wherein said memory means comprises means for translating said analog signals into a plurality of binary signal patterns, on a 1-to-N basis, that is, one group of binary signals representing N successive analog signals, where N is an integer greater than 1, and wherein said memory means further comprises a plurality of closed loops, each for continuously circulating a different signal of said binary signal patterns, and an output circuit for retranslating said binary signal patterns to the analog signals they represent.

* * * * *